(12) United States Patent
Göötz et al.

(10) Patent No.: US 11,158,770 B2
(45) Date of Patent: Oct. 26, 2021

(54) OPTOELECTRONIC COMPONENT WITH ORGANIC AND INORGANIC PHOSPHORS AND LIGHTING APPARATUS

(71) Applicant: OSRAM Opto Semiconductors GmbH, Regensburg (DE)

(72) Inventors: Britta Göötz, Regensburg (DE); Frank Singer, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/294,789

(22) Filed: Mar. 6, 2019

(65) Prior Publication Data

US 2019/0280168 A1    Sep. 12, 2019

(30) Foreign Application Priority Data

Mar. 6, 2018  (DE) .......................... 102018105085.2

(51) Int. Cl.
*H01L 33/50* (2010.01)

(52) U.S. Cl.
CPC .......... *H01L 33/504* (2013.01); *H01L 33/507* (2013.01)

(58) Field of Classification Search
CPC ....... H01L 33/48–486; H01L 33/52–56; H01L 33/50–508; H01L 25/167
See application file for complete search history.

(56) References Cited

U.S. PATENT DOCUMENTS

| 2006/0214578 | A1 | 9/2006 | Iwanaga et al. | |
| 2008/0265268 | A1 | 10/2008 | Braune et al. | |
| 2009/0173957 | A1 | 7/2009 | Brunner et al. | |
| 2013/0264937 | A1* | 10/2013 | Sakuta | H01L 33/504 313/503 |
| 2015/0131278 | A1* | 5/2015 | Chen | F21V 19/002 362/235 |
| 2016/0126428 | A1* | 5/2016 | Hosokawa | H01L 33/502 257/98 |
| 2017/0331012 | A1 | 11/2017 | Heidemann et al. | |

FOREIGN PATENT DOCUMENTS

DE    102006020529 A1    3/2007

* cited by examiner

*Primary Examiner* — Laura M Menz
*Assistant Examiner* — Candice Chan
(74) *Attorney, Agent, or Firm* — Slater Matsil, LLP (57) ABSTRACT

An optoelectronic component and a lighting apparatus are disclosed. In an embodiment an optoelectronic component includes a carrier having an upper side and an underside opposite the upper side, an optoelectronic semiconductor chip arranged on the upper side of the carrier, the semiconductor chip configured to emit primary radiation during operation via one or more sides. The component further includes a first conversion layer having an inorganic phosphor on the semiconductor chip, the first conversion layer covering at least all radiation-emitting sides of the semiconductor chip not facing the carrier and a solid body in which an organic phosphor is distributed, wherein the solid body is arranged and fastened on the carrier and is at least in indirect contact with the carrier, and wherein the solid body is spaced from the radiation-emitting sides of the semiconductor chip at least by the first conversion layer and/or by the carrier.

20 Claims, 5 Drawing Sheets

OPTOELECTRONIC COMPONENT WITH ORGANIC AND INORGANIC PHOSPHORS AND LIGHTING APPARATUS

CROSS-REFERENCE TO RELATED APPLICATIONS

This application claims the benefit of German patent application 102018105085.2, filed on Mar. 6, 2018, which application is hereby incorporated herein by reference.

TECHNICAL FIELD

An optoelectronic component is specified. In addition, a lighting apparatus is specified.

SUMMARY

Embodiments provide an ageing stable optoelectronic component. Further embodiments provide a lighting apparatus, for example, for interior lighting, with such an optoelectronic component.

According to at least one embodiment, the optoelectronic component comprises a carrier having an upper side and an underside opposite the upper side. The upper side and underside can be parallel to each other and/or flat or even within the manufacturing tolerance.

The terms "upper side" and "underside" or similar terms are in no way to be understood as restricting alignments with respect to the gravitational direction. Rather, they are generally used, for example, to identify opposing areas or directions.

For example, the carrier has a thickness, in particular an average thickness, measured from upper side to the underside, of at least 50 µm or at least 100 µm. An area of the upper side and the underside may be at least 50 mm$^2$ or at least 100 mm$^2$. In particular, the upper side and the underside are rectangular. A length of the upper side and the underside is preferably greater, for example, at least 5 times or at least 10 times or at least 20 times greater than a width of the upper side and the underside.

According to at least one embodiment, the optoelectronic component comprises an optoelectronic semiconductor chip arranged on the upper side of the carrier. This means that at least one optoelectronic semiconductor chip, preferably several optoelectronic semiconductor chips, is arranged on the upper side.

In particular, the optoelectronic component described here is an LED filament.

The optoelectronic semiconductor chip comprises a semiconductor layer sequence with an active layer for generating electromagnetic radiation. The semiconductor layer sequence, for example, is based on a III-V compound semiconductor material. For example, the semiconductor material is a nitride compound semiconductor material, such as $Al_nIn_{1-n-m}Ga_mN$, or a phosphide compound semiconductor material, such as $Al_nIn_{1-n-m}Ga_mP$, or an arsenide compound semiconductor material, such as $Al_nIn_{1-n-m}Ga_mAs$ or $Al_nIn_{1-n-m}Ga_mAsP$, with $0 \leq n \leq 1$, $0 \leq m \leq 1$ and $m+n \leq 1$, respectively. The semiconductor layer sequence may contain dopants as well as additional components. For the sake of simplicity, however, only the essential components of the crystal lattice of the semiconductor layer sequence, i.e., Al, As, Ga, In, N or P, are given, even if these may be partially replaced and/or supplemented by small quantities of other substances. The semiconductor layer sequence is preferably based on AlInGaN.

The active layer of the semiconductor layer sequence contains in particular at least one pn junction and/or at least one quantum well structure and can, for example, generate electromagnetic primary radiation in the blue or green or red spectral range or in the UV range during intended operation. The semiconductor chip preferentially comprises one active layer, in particular exactly one contiguous, in particular simply-connected active layer. Alternatively, the active layer can also be segmented.

A semiconductor chip is understood here and in the following as an element that can be handled separately and that can be electrically contacted. A semiconductor chip is created by separation from a wafer composite. In particular, side surfaces or transverse sides of such a semiconductor chip then show traces from the separation process of the wafer composite, for example. A semiconductor chip preferably comprises exactly one originally contiguous region of the semiconductor layer sequence grown in the wafer composite. The semiconductor layer sequence of the semiconductor chip is preferably formed contiguously. For example, the lateral expansion of the semiconductor chip measured parallel to the main direction of expansion of the active layer is not more than 1% or not more than 5% greater than the lateral expansion of the active layer or of the semiconductor layer sequence. The semiconductor chip, for example, also includes the growth substrate on which the entire semiconductor layer sequence has grown.

The semiconductor chip can be a so-called volume emitter, in particular a flip chip. In this case, the semiconductor chip also preferentially includes the growth substrate, which is formed from sapphire, for example. Alternatively, the semiconductor chip can also be a surface emitter, in particular a so-called thin-film chip. In this case the growth substrate is detached, for example.

According to at least one embodiment, the optoelectronic component comprises a first conversion layer with an inorganic phosphor on the semiconductor chip. The first conversion layer may be in direct contact with the semiconductor chip. The first conversion layer may, for example, include a matrix material, such as silicone or silazane or epoxy, in which phosphor particles of an inorganic phosphor are embedded. The inorganic phosphor is, for example, a YAG or a LuAG or LuYAG or a SiAlON. Phosphor particles from different phosphors, in particular from different inorganic phosphors, can also be distributed in the first conversion layer.

For example, the first conversion layer has a thickness between 5 µm and 70 µm inclusive, preferably between 10 µm and 40 µm inclusive. Thickness is understood to mean in particular the mean thickness of the first conversion layer. The first conversion layer is preferably contiguous or simply-connected. The first conversion layer can be made in one piece. Within the first conversion layer, a mass fraction of phosphor particles from an inorganic phosphor is preferably at least 10% or at least 30%. Alternatively or in addition, the mass fraction may not exceed 70%. The phosphor particles from an inorganic phosphor are preferably homogeneously distributed in the first conversion layer within the manufacturing tolerance. The first conversion layer may be sprayed onto the semiconductor chip and/or on the carrier.

According to at least one embodiment, the optoelectronic component comprises a solid body in which an organic phosphor is distributed. The solid body comprises in particular a matrix material, such as silicone or silazane or epoxy, in which phosphor particles from the organic phosphor are distributed. In the volume of the solid body, the phosphor particles from the organic phosphor are preferably homogeneously distributed within the manufacturing tolerance. Phosphor particles from several organic phosphors can also be distributed, in particular homogeneously, in the solid body. The mass fraction of phosphor particles of an organic phosphor in the solid body is, for example, at least 0.001% or at least 0.01% or at least 0.1%. Alternatively or additionally, the mass fraction of phosphor particles from an organic phosphor in the solid body shall not exceed, for example, 1%.

The organic phosphor may, for example, comprise or consist of perylene or rhodamine or coumarin.

A solid body is understood here as a contiguous, preferably simply-connected body. Within the manufacturing tolerance, the solid body is especially free of enclosed, gas-filled cavities. The solid body is preferably made in one piece. This means that all regions of the solid body are integrally formed with each other and contain the same material or consist of the same material. The solid body, for example, is made of one piece. Preferably, the solid body is not formed in one piece with the first conversion layer.

According to at least one embodiment, the semiconductor chip emits primary radiation during operation via one or more sides. The sides of the semiconductor chip in this context are the outer sides or outer surfaces of the semiconductor chip, for example, an upper side, an underside and transverse sides of the semiconductor chip. The upper side and underside of the semiconductor chip are preferably aligned parallel to the upper side of the carrier. The transverse sides of the semiconductor chip are then aligned crosswise or perpendicular to the upper side of the carrier. In particular, the semiconductor chip emits radiation during operation at least via its upper side facing away from the carrier. Preferably, the semiconductor chip also emits primary radiation via its transverse sides and/or via its underside.

According to at least one embodiment, the first conversion layer covers at least all radiation-emitting sides of the semiconductor chip that are not facing the carrier. The radiation-emitting sides of the semiconductor chip are the sides via which primary radiation is decoupled from the semiconductor chip during intended operation. For example, the first conversion layer covers all sides of the semiconductor chip that are not facing the carrier. The first conversion layer in each case preferably completely or at least by 80% covers the sides of the semiconductor chip.

The underside of the semiconductor chip facing the carrier can be bonded to the carrier using a soldering material or adhesive, for example.

According to at least one embodiment, the solid body is arranged and fastened on the carrier and is at least in indirect contact with the carrier. The solid body is preferred in places in direct contact with the carrier, for example, with the upper side of the carrier or the underside of the carrier or with a transverse side of the carrier connecting the upper side and the underside.

The solid body is preferably arranged in such a way that the solid body completely covers the semiconductor chip when viewed along a surface normal of the upper side of the carrier. "Fastened" in this case means that the solid body cannot be detached from the carrier in a non-destructive manner. Indirect contact means that further solids can be arranged between the carrier and the solid body, connecting the carrier and the solid body.

For example, a distance of the solid body from the semiconductor chip or from the active layer of the semiconductor chip is not more than 500 µm or not more than 200 µm or not more than 100 µm.

According to at least one embodiment, the solid body is spaced from the radiation-emitting sides of the semiconductor chip at least by the first conversion layer and/or by the carrier. In particular, the solid body is at no point in direct contact with the radiation-emitting sides of the semiconductor chip. The solid body is preferably not in direct contact with any side of the semiconductor chip. A distance of the solid body from at least the radiation-emitting sides of the semiconductor chip, for example, is at least 10 µm or at least 20 µm everywhere. However, the solid body can be in direct contact with the first conversion layer.

In at least one embodiment, the optoelectronic component comprises a carrier having an upper side and an underside opposite the upper side, an optoelectronic semiconductor chip arranged on the upper side of the carrier, a first conversion layer comprising an inorganic phosphor on the semiconductor chip, and a solid body in which an organic phosphor is dispersed. During operation, the semiconductor chip emits primary radiation via one or more sides. The first conversion layer covers all radiation-emitting sides of the semiconductor chip that are not facing the carrier. The solid body is arranged and fastened on the carrier and is at least in indirect contact with the carrier. The solid body is also spaced from the radiation-emitting sides of the semiconductor chip at least by the first conversion layer and/or carrier.

Embodiments of this invention are based, inter alia, on the knowledge that inorganic phosphors, especially red inorganic phosphors, are usually expensive. However, red phosphors are often used in LEDs for lighting purposes. Organic phosphors, especially red organic phosphors, are cheaper, but not necessarily stable. Especially when red organic phosphors are exposed to a high proportion of blue light and simultaneously operated at high temperatures, these phosphors age very quickly.

Embodiments of this invention make use, inter alia, of the idea of using an organic phosphor in a solid body and to distance the solid body from the semiconductor chip emitting primary radiation by means of a first conversion layer or a carrier. This allows the density of the primary radiation incident on the organic phosphor to be reduced, especially if some of the primary radiation is previously converted by the inorganic phosphor in the first conversion layer.

According to at least one embodiment, the solid body is not in direct contact with the semiconductor chip. A minimum distance of the solid body to the semiconductor chip, for example, to the sides of the semiconductor chip or to the semiconductor material of the semiconductor chip, is preferably at least 10 µm or at least 20 µm or at least 50 µm.

According to at least one embodiment, the optoelectronic component is configured such that during operation primary radiation emitted by the semiconductor chip must always first pass through the first conversion layer or the carrier in order to reach the solid body. This means that each link between the semiconductor chip and the solid body crosses either the carrier or the first conversion layer.

According to at least one embodiment, the first conversion layer is free of the organic phosphor of the solid body within the manufacturing tolerance. Preferably, the first conversion layer is free of any organic phosphor within the manufacturing tolerance. For example, the mass fraction of organic phosphors in the first conversion layer is at most 0.001%.

The solid body may be free of the inorganic phosphor of the first conversion layer or free of any inorganic phosphor within the manufacturing tolerance.

According to at least one embodiment, the solid body is arranged on the upper side of the carrier. The semiconductor chip and the first conversion layer are then preferably embedded in the solid body. For example, the first conversion layer is in direct contact with the solid body. In particular, the solid body shapes the semiconductor chip with the first conversion layer applied to it in a form-fitting or conformal manner. Each side of the semiconductor chip that is not covered by the carrier can then be completely covered by the solid body.

Here, the solid body is therefore in particular a shaped body that shapes the semiconductor chip and the first conversion layer. For example, the solid body is applied to the carrier by means of dispensing or jetting.

The solid body may cover the entire upper side or at least 80% or at least 90% of the upper side of the carrier. In certain regions, the solid body can be in direct contact with the carrier on the upper side.

According to at least one embodiment, the solid body is arranged on the underside of the carrier. For example, the solid body is in direct contact with the carrier on the underside. For example, the solid body covers the underside completely or at least 80% or at least 90% of it.

The solid body can be arranged both on the underside and on the upper side. In this case the solid body can be divided into two sections which are not connected. The first section covers the upper side, the second section the underside. Preferably, the first and the second section are each formed in one piece and contiguously.

It is also possible, however, that the two sections are merged on transverse sides of the carrier. The solid body is then formed contiguously or simply-connected.

According to at least one embodiment, a volume fraction of the solid body on the optoelectronic component is larger, for example, at least 1.5 times larger or at least 2 times larger or at least 3 times larger or at least 5 times larger, than the sum of the volume fractions of the semiconductor chip, the first conversion layer and the carrier. If the component comprises several semiconductor chips, the volume fraction of the solid body can be larger, especially by the aforementioned factors, than the sum of the volume fractions of all semiconductor chips, the associated first conversion layer and the carrier.

According to at least one embodiment, the carrier is translucent to visible light. In particular, the carrier is transparent to visible light. For example, the carrier is made of a glass or sapphire.

According to at least one embodiment, the carrier is self-supporting and carries the semiconductor chip.

According to at least one embodiment, primary radiation and/or secondary radiation generated by conversion of the primary radiation enters the carrier via the upper side of the carrier during intended operation of the component and exits the carrier at the underside of the carrier.

During operation, the optoelectronic component preferentially emits radiation in the two opposite directions perpendicular to the upper side or underside of the carrier.

According to at least one embodiment, an outer side or outer surface of the solid body facing away from the carrier is convexly curved, preferably convexly curved throughout. This outer side of the solid body can form the outer surface of a cylinder, for example, a circular cylinder or an elliptical cylinder. The outer side can also form only a part of such an outer surface. For example, the mean or maximum or minimum radius of curvature of this outer side is between 0.2 mm and 2 mm inclusive. The outer side of the solid body is, for example, smooth within the manufacturing tolerance.

For example, on the outer side of the solid body a scattering layer can be applied for diffuse scattering of the radiation coming from the solid body. This can lead to a uniform optical impression of the radiation emitted by the component.

The outer side of the solid body can also form an outer surface of the optoelectronic component via which radiation is decoupled from the optoelectronic component.

According to at least one embodiment, the solid body completely covers the upper side and/or the underside. Transverse sides of the carrier can be free of the solid body. Alternatively, the transverse sides of the carrier are also covered by the solid body, in particular completely covered.

According to at least one embodiment, the semiconductor chip, the first conversion layer and the carrier are embedded in the solid body. This means that the solid body forms the semiconductor chip, the first conversion layer and the carrier in a form-fitting manner. The semiconductor chip, the conversion layer and the carrier are then completely surrounded by the solid body in at least one cross-sectional view. In particular, the solid body is arranged such that the solid body surrounds the semiconductor chip, the conversion layer and the carrier in all directions perpendicular to a direction parallel to the upper side of the carrier. If the carrier is elongated, the carrier, the semiconductor chip and the first conversion layer are preferably surrounded by the solid body in all directions perpendicular to the longitudinal direction of the carrier.

According to at least one embodiment, the semiconductor chip generates primary radiation with an intensity maximum at a first wavelength during operation. The primary radiation, for example, lies in the blue spectral range or in the UV range. The first wavelength, for example, lies in the spectral range between 350 nm and 480 nm inclusive.

An intensity maximum is understood in particular as a global intensity maximum.

According to at least one embodiment, the inorganic phosphor of the first conversion layer is configured to convert the primary radiation into secondary radiation with an intensity maximum at a second wavelength. The second wavelength is greater than the first wavelength. For example, the secondary radiation lies in the yellow and/or green spectral range. The second wavelength, for example, lies in the range between 490 nm and 600 nm inclusive.

According to at least one embodiment, the organic phosphor of the solid body is configured to convert the primary radiation and/or the secondary radiation into a tertiary radiation with an intensity maximum at a third wavelength. The third wavelength is preferably larger than the second wavelength, for example, by at least 50 nm. The tertiary radiation, for example, lies in the red and/or orange spectral range. For example, the third wavelength lies in the range between 600 nm and 780 nm inclusive.

During operation, the component then preferentially emits a mixture of secondary and tertiary radiation, possibly with a proportion of primary radiation.

According to at least one embodiment, the optoelectronic component comprises a plurality of semiconductor chips lined up along a line, in particular a straight line, on the upper side of the carrier. Each of these semiconductor chips can be a semiconductor chip as described above. All the other features mentioned above relating to one semiconductor chip may also apply to the plurality of semiconductor chips. In particular, the radiation-emitting sides of the semiconductor chips may be covered by their own or the same first conversion layer. The solid body preferably covers all semiconductor chips when viewed along a normal to the upper side.

The semiconductor chips are, for example, electrically connected in series.

By lining up several semiconductor chips on a common carrier, an LED filament in particular is realized.

According to at least one embodiment, one or more optoelectronic semiconductor chips are arranged on the underside of the carrier. The same features can also be realized for the semiconductor chips arranged on the underside as for the semiconductor chip(s) arranged on the upper side.

According to at least one embodiment, a second conversion layer comprising an inorganic phosphor is disposed between the semiconductor chip and the carrier and/or on the underside of the carrier. The second conversion layer can be designed in the same way as the first conversion layer and can be connected to it. The second conversion layer can be in direct contact with the carrier. In particular, the second conversion layer is arranged in such a way that primary radiation emitted from the semiconductor chip in the direction of the carrier must first pass through the carrier and the second conversion layer before it can escape from the component or enter the solid body arranged on the underside. If the solid body and the second conversion layer are located on the underside of the carrier, the second conversion layer is preferably located in the region between the carrier and the solid body.

In addition, embodiments provide a lighting apparatus. The lighting apparatus comprises one or more optoelectronic components as described above. This means that all features disclosed in connection with the optoelectronic component are also disclosed for the lighting apparatus and vice versa.

The lighting apparatus can be used in particular in a luminaire, for example, an interior luminaire, such as a wall luminaire or ceiling luminaire or table lamp.

According to at least one embodiment, the lighting apparatus comprises several similar optoelectronic components according to one or more of the previously described embodiments. "Similar optoelectronic components" are components that are identical within the manufacturing tolerance. This means that the components are identical with the exception of manufacturing tolerances.

According to at least one embodiment, the similar optoelectronic components are arranged in such a way that the undersides of the carriers face one another and the upper sides of the carriers face one another. In particular, during operation, each optoelectronic component emits radiation in the two opposite directions perpendicular to the upper side of the associated carrier. The optoelectronic components are then aligned so that the radiation emitted in the different directions always mix to form the same mixed radiation.

According to at least one embodiment, the lighting apparatus comprises at least one or exactly one optoelectronic component according to one or more of the previously described embodiments.

According to at least one embodiment, the lighting apparatus comprises a reflector configured to reflect radiation emitted from the component in a direction perpendicular to the upper side of the carrier in the opposite direction. The reflector thus produces a mixture of the radiation emitted by the component in the two opposite directions, whereby the asymmetrical radiation properties of the component can be compensated for.

According to at least one embodiment, the component is rotatably mounted in the lighting apparatus. During operation, for example, the component is rotated by a motor of the lighting apparatus in order to homogenize the radiated radiation.

BRIEF DESCRIPTION OF THE DRAWINGS

In the following, an optoelectronic component described here as well as a lighting apparatus described here will be explained in more detail with reference to drawings on the basis of exemplary embodiments. Same reference signs indicate the same elements in the individual figures. However, the size ratios involved are not to scale, individual elements may rather be illustrated with an exaggerated size for a better understanding.

As shown in.

DETAILED DESCRIPTION OF ILLUSTRATIVE EMBODIMENTS

Figure 1:
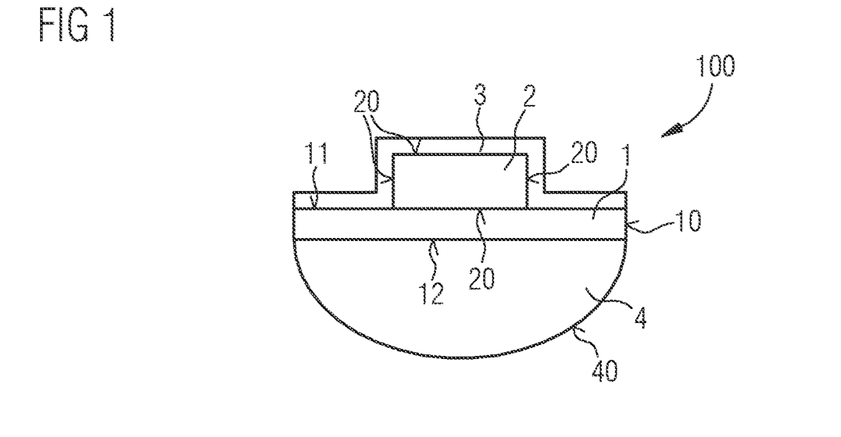
FIGS. 1 to 3 and 5 to 11 show exemplary embodiments of an optoelectronic component in cross-sectional views.

FIG. 1 shows an exemplary embodiment of the optoelectronic component 100 in cross-sectional view. Component 100 comprises a transparent carrier 1, such as a glass carrier or sapphire carrier. A semiconductor chip 2 is mounted on an upper side 11 of carrier 1. A solid body 4 is arranged on an underside 12 of the carrier 1 opposite the upper side 11.

Semiconductor chip 1, for example, is a GaN-based volume emitter. The semiconductor chip 2 emits radiation on all sides 20 during operation. The sides 20 of the semiconductor chip 2 not facing the carrier 1 are all covered with a first conversion layer 3. The first conversion layer 3, for example, comprises a matrix material, such as silicone, with inorganic phosphor particles embedded in it. During operation, for example, the semiconductor chip 2 emits primary radiation in the blue spectral range or in the UV range. The inorganic phosphor particles are configured to convert this primary radiation into secondary radiation, for example, in the green and/or yellow spectral range.

For example, the solid body 4 arranged on the underside 12 of carrier 1 also comprises a matrix material, such as silicone, in which organic phosphor particles are homogeneously distributed within the manufacturing tolerance. The solid body 4 is applied directly to the underside 12 by means of dispensing or jetting, for example. In this case, the solid body 4 covers the entire underside 12 of the carrier 1. An outer side 40 of the solid body 4 facing away from the carrier 1 is convexly curved.

For example, the organic phosphor in the solid body 4 is configured to convert primary and/or secondary radiation into tertiary radiation, particularly in the red and/or orange spectral range. The organic phosphor, for example, is a parylene.

The advantage of component 100 is that the solid body 4 with the organic phosphor is not directly applied to the semiconductor chip 2, but spaced from the semiconductor chip 2 by the carrier 1. As a result, the luminance in the region of the organic phosphor is lower, which has a positive effect on the service life of the organic phosphor.

Figure 2:
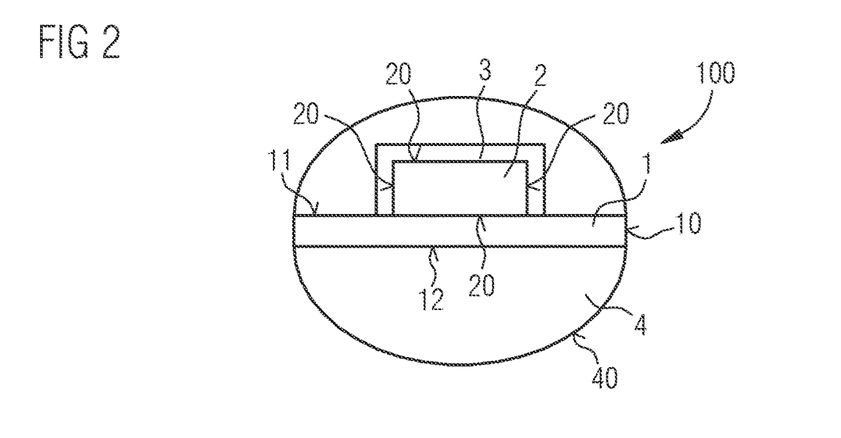

In the exemplary embodiment of FIG. 2, in contrast to the exemplary embodiment of FIG. 1, the solid body 4 is additionally attached to the upper side 11 of carrier 1 and completely covers the upper side 11. The semiconductor chip 2 and the first conversion layer 3 are embedded in the solid body 4 and are surrounded by the solid body 4 form-fittingly.

In this case, the solid body 4 is formed in two sections, namely a first section on the upper side 11 and a second section on the underside 12. The two sections of the solid body 4 are not connected. In particular, transverse sides 10 of the carrier 1 are free of the solid body 4. The outer surfaces of the component 100 are formed only by the outer sides 40 of the solid body 4 and by the transverse sides 10 of the carrier 1.

Figure 3:
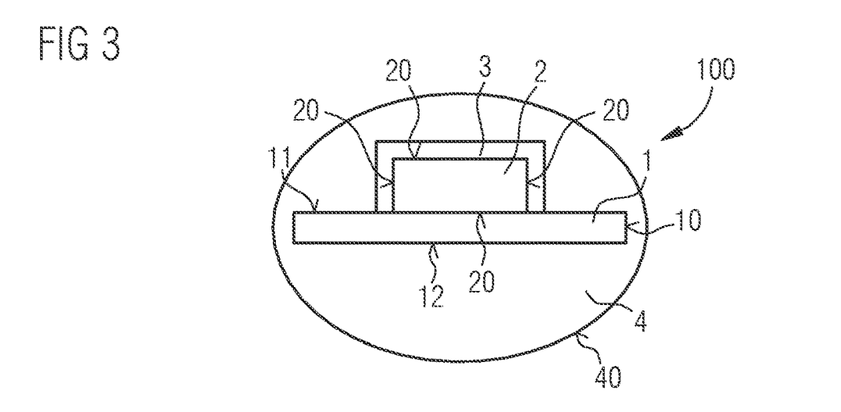

In the exemplary embodiment of FIG. 3, in contrast to the exemplary embodiment of FIG. 2, the two sections of the solid body 4 are joined over the transverse sides 10 of the carrier 1 so that the transverse sides 10 of the carrier 1 are also covered by the solid body 4. The solid body 4 of FIG. 3 is therefore a contiguous body.

Figure 4:
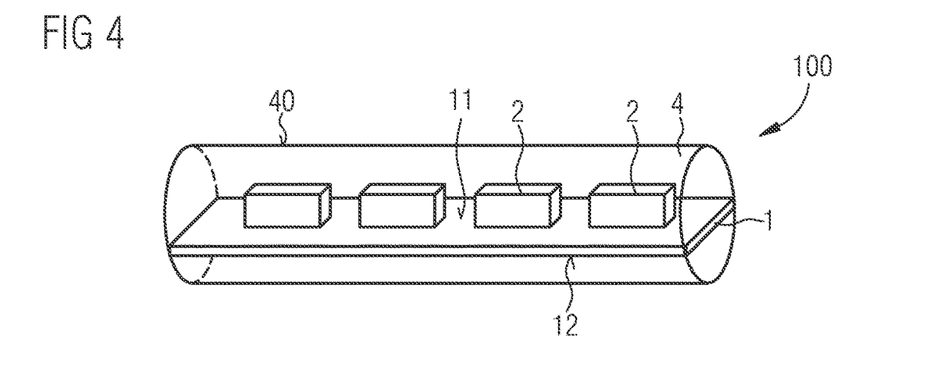
FIG. 4 shows an exemplary embodiment of an optoelectronic component in a perspective view.

FIG. 4 shows the perspective view of an exemplary embodiment of the component 100. It can be any of the exemplary embodiments of FIGS. 2, 3 and 6 to 11. For reasons of clarity, only the semiconductor chips 2, the carrier 1 and the solid body 4 are shown in FIG. 4.

The upper side of the carrier 1 is elongated with a main direction of extension along a longitudinal axis. The cross-sectional views of the components 100 (see FIGS. 2, 3 and 6 to 11) are cross-sectional views for cross-sections perpendicular to this longitudinal axis.

On the upper side 11 of carrier 1, a plurality of semiconductor chips 2 is lined up along the longitudinal axis. The solid body 4 surrounds the semiconductor chips 2 and the carrier 1. The outer side 40 of the solid body 4 forms the outer surface of a circular cylinder or elliptical cylinder.

The optoelectronic component 100 of FIG. 4 is an LED filament.

Figure 5:
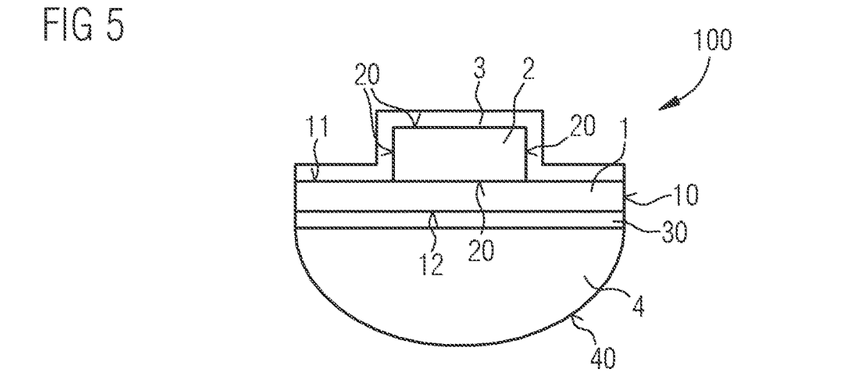

FIG. 5 shows another exemplary embodiment of an optoelectronic component 100 in cross-sectional view. The solid body 4 is arranged as in FIG. 1 only on the underside 12 of carrier 1. In contrast to FIG. 1, however, a second conversion layer 30 is provided between the solid body 4 and the underside 12, which, for example, has the same composition as the first conversion layer 3.

In this exemplary embodiment, primary radiation emitted by the semiconductor chip 2 always strikes a conversion layer with an inorganic phosphor first, which at least partially converts the primary radiation. The proportion of primary radiation that hits the organic phosphor of the solid body 4 is thus reduced. This means that the organic phosphor must convert less primary radiation and more secondary radiation into tertiary radiation, which at the same time means less heat generation in the organic phosphor and thus a longer service life.

Figure 6:
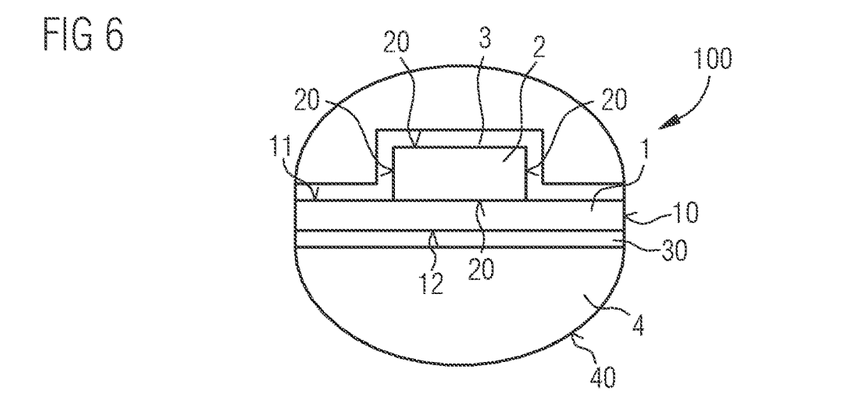
Figure 7:
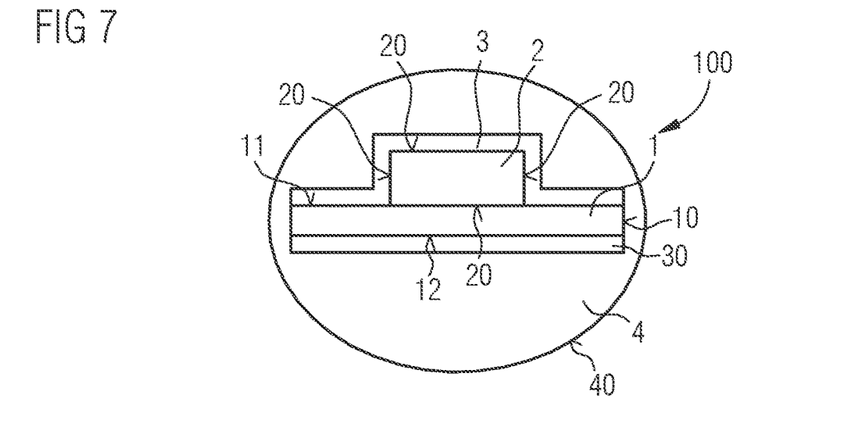

In the exemplary embodiments of FIGS. 6 and 7, the solid body 4 is also applied to the upper side 11 of carrier 1, wherein in FIG. 6 the transverse sides 10 of the carrier 1 are free and in FIG. 7 are covered by the solid body 4.

Figure 8:
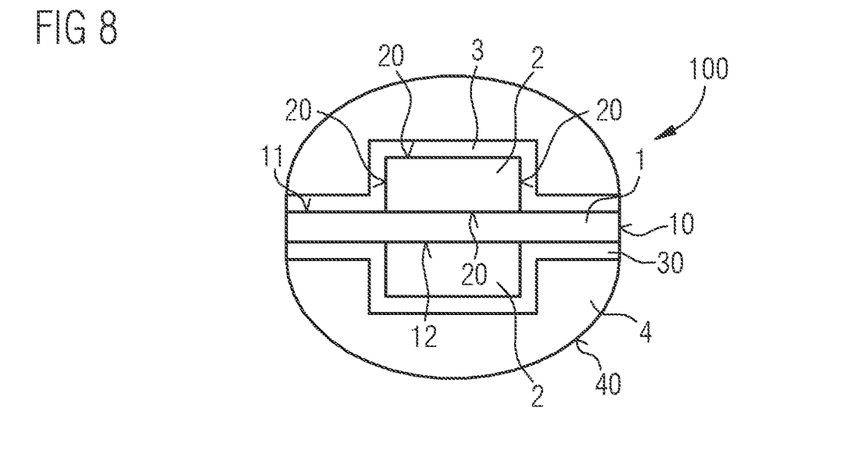
Figure 9:
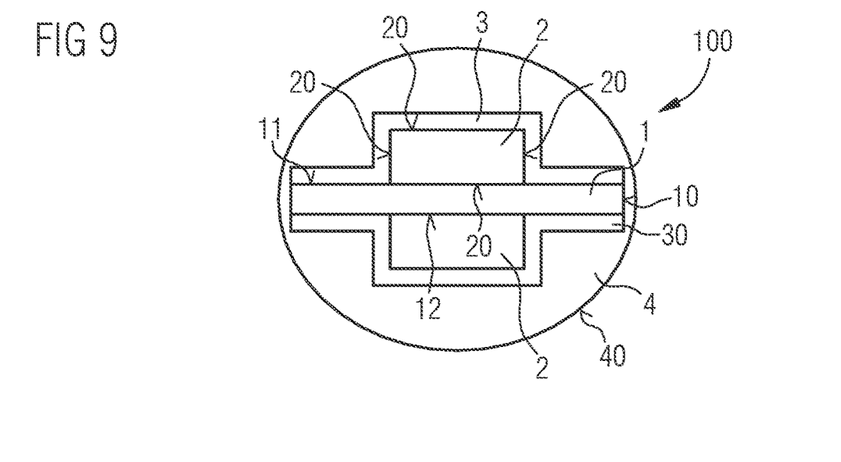

FIGS. 8 and 9 show exemplary embodiments in which one or more semiconductor chips 2 are arranged on both the upper side 11 and the underside 12 of the carrier 1. For example, several semiconductor chips 2 are lined up along the longitudinal axis of the carrier 1 on the upper side 11 and on the underside 12.

The semiconductor chip or chips 2 on the underside 12 are covered with a second conversion layer 30. The second conversion layer 30, for example, covers all sides 20 of the semiconductor chip 2 that are not facing the carrier 1.

Figure 10:
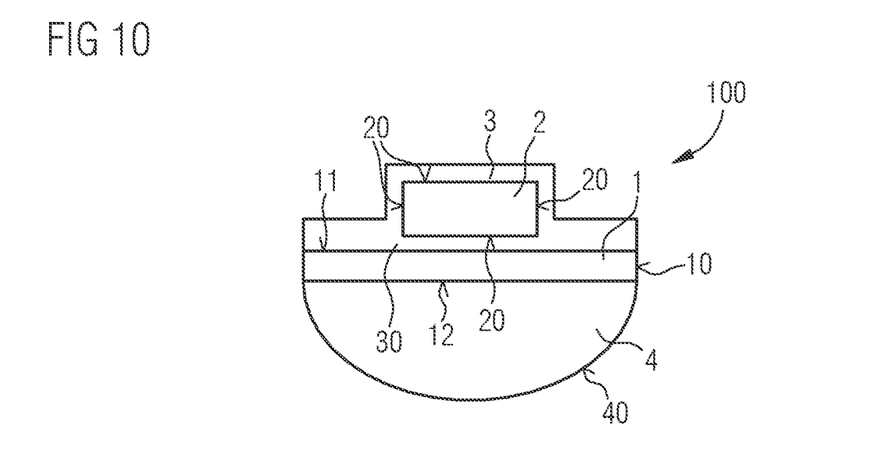

The exemplary embodiment of FIG. 10 differs from the exemplary embodiment of FIG. 1 in that a second conversion layer 30 is provided between the semiconductor chip 2 arranged on the upper side 11 and the upper side 11, which is connected to the first conversion layer 3 and preferably has the same composition. In particular, the entire side 20 of the semiconductor chip 2 facing carrier 1 is coated with the second conversion layer 30. This prevents primary radiation from the semiconductor chip 2 from hitting the solid body 4 without first passing through the second conversion layer 30.

Figure 11:
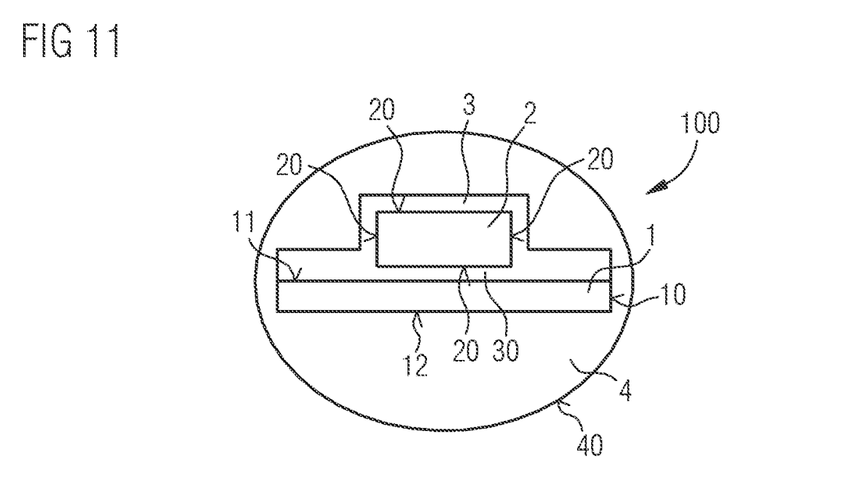

In the exemplary embodiment of FIG. 11, in contrast to the exemplary embodiment of FIG. 10, the solid body 4 is additionally attached to the upper side 11 of carrier 1 again.

In the exemplary embodiment described above, the transverse sides 10 of the carrier 1 are sometimes covered and sometimes free of the solid body 4. This can be influenced, for example, by the amount of material of the solid body 4 applied during dispensing or jetting.

Figure 12:
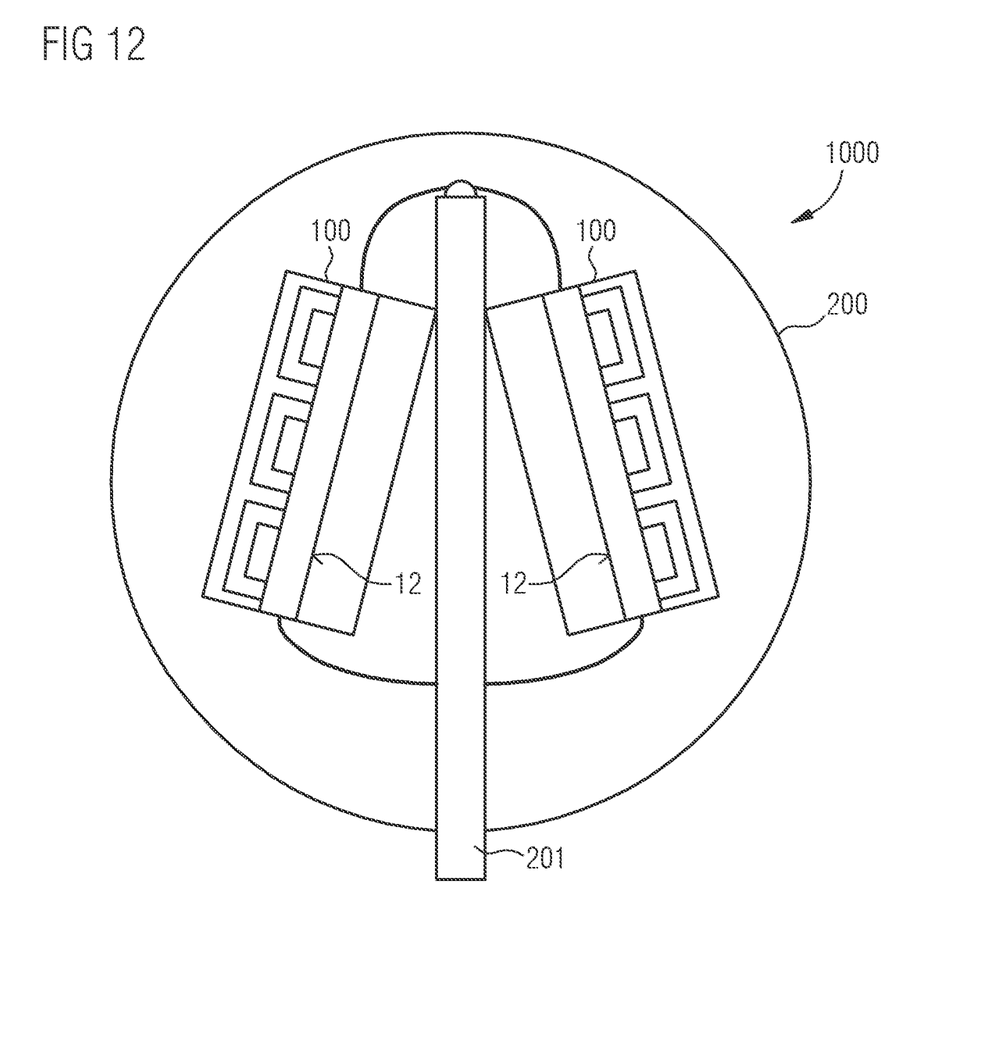
FIG. 12 shows an exemplary embodiment of a lighting apparatus.

FIG. 12 shows an exemplary embodiment of lighting apparatus 1000 in cross-sectional view. The lighting apparatus woo comprises two optoelectronic components 100 according to one of the previous exemplary embodiments. The components 100 are attached to a 201 pump stem and electrically contacted via wires. The components 100 are enclosed in a housing 200. The housing 200 is preferably filled with a protective gas, such as helium, and hermetically sealed to the outside. In particular, the lighting apparatus woo of FIG. 12 is a retrofit light bulb.

The components 100 of FIG. 12 are designed in such a way that radiation emitted in the direction away from the upper side 11 of the carrier 1 is in each case a mixture of primary radiation, secondary radiation and tertiary radiation, whereas radiation emitted in the opposite direction away from the underside 12 is only a mixture of primary radiation and tertiary radiation. This means that the components 100 emit different mixed radiation in both directions away from the carrier 1.

In order to guarantee a uniform color image for a user of the lighting apparatus 1000, the undersides 12 of the two components 100 are facing each other. Thus, the radiations emitted by the two components 100 mix to form a mixed radiation in such a way that essentially light with the same light color is emitted in all spatial directions.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

What is claimed is:

1. An optoelectronic component comprising:
   a carrier having an upper side and an underside opposite the upper side;
   an optoelectronic semiconductor chip arranged on the upper side of the carrier, the semiconductor chip configured to emit primary radiation during operation via one or more sides;
   a first conversion layer having an inorganic phosphor on the semiconductor chip, the first conversion layer covering at least all radiation-emitting sides of the semiconductor chip not facing the carrier; and
   a solid body in which an organic phosphor is distributed, wherein the solid body is arranged and fastened on the carrier and is at least in indirect contact with the carrier, wherein the solid body is spaced from the radiation-emitting sides of the semiconductor chip at least by the first conversion layer and/or by the carrier, and wherein a volume portion of the solid body is larger than a sum of volume portions of the semiconductor chip, the first conversion layer and the carrier for an entire volume of the optoelectronic component.

2. The optoelectronic component according to claim 1,
wherein the solid body is not in direct contact with the semiconductor chip, and
wherein the optoelectronic component is configured such that, during the operation, the primary radiation emitted by the semiconductor chip passes always first through the first conversion layer or the carrier in order to reach the solid body.

3. The optoelectronic component according to claim 1, wherein the first conversion layer is free of the organic phosphor of the solid body within a manufacturing tolerance.

4. The optoelectronic component according to claim 1, wherein the solid body is arranged on the upper side of the carrier, and wherein the semiconductor chip and the first conversion layer are embedded in the solid body.

5. The optoelectronic component according to claim 1, wherein the solid body is arranged on the underside of the carrier.

6. The optoelectronic component according to claim 1,
wherein the carrier is translucent to visible light,
wherein the carrier is self-supporting and carries the semiconductor chip, and
wherein the primary radiation and/or secondary radiation generated by conversion of the primary radiation enters the carrier via the upper side and exits the carrier at the underside during the operation of the optoelectronic component.

7. The optoelectronic component according to claim 1, wherein an outer side of the solid body facing away from the carrier is convexly curved.

8. The optoelectronic component according to claim 1, wherein the solid body completely covers the upper side and/or the underside of the carrier.

9. The optoelectronic component according to claim 1, wherein the semiconductor chip, the first conversion layer and the carrier are embedded in the solid body.

10. The optoelectronic component according to claim 1,
wherein the semiconductor chip is configured to generate the primary radiation with an intensity maximum at a first wavelength during the operation,
wherein the inorganic phosphor of the first conversion layer is configured to convert the primary radiation into secondary radiation having an intensity maximum at a second wavelength, the second wavelength being greater than the first wavelength, and
wherein the organic phosphor of the solid body is configured to convert the primary radiation and/or the secondary radiation into tertiary radiation having an intensity maximum at a third wavelength, the third wavelength being greater than the second wavelength.

11. The optoelectronic component according to claim 1, wherein the optoelectronic component comprises a plurality of semiconductor chips lined up along a line on the upper side of the carrier.

12. The optoelectronic component according to claim 1, wherein one or more optoelectronic semiconductor chips are arranged on the underside of the carrier.

13. The optoelectronic component according to claim 1, further comprising a second conversion layer comprising an inorganic phosphor, wherein the second conversion layer is disposed between the semiconductor chip and the carrier and/or on the underside of the carrier.

14. A lighting apparatus comprising:
a plurality of the optoelectronic components according to claim 1,
wherein the optoelectronic components are arranged with respect to one another such that undersides of the carriers face one another or upper sides of the carriers face one another.

15. An optoelectronic component comprising:
a carrier having an upper side and an underside opposite the upper side, the carrier being translucent to visible light and self-supporting;
an optoelectronic semiconductor chip arranged on the upper side of the carrier, the semiconductor chip configured to emit primary radiation during operation via one or more sides, wherein the carrier carries the semiconductor chip;
a first conversion layer having an inorganic phosphor on the semiconductor chip, the first conversion layer covering at least all radiation-emitting sides of the semiconductor chip not facing the carrier; and
a solid body in which an organic phosphor is distributed,
wherein the solid body is arranged and fastened on the carrier and is at least in indirect contact with the carrier,
wherein the solid body is spaced from the radiation-emitting sides of the semiconductor chip at least by the first conversion layer and/or by the carrier, and
wherein the primary radiation and/or secondary radiation generated by conversion of the primary radiation enters the carrier via the upper side and exits the carrier at the underside during the operation of the optoelectronic component.

16. The optoelectronic component according to claim 15, wherein the optoelectronic component comprises a plurality of semiconductor chips lined up along a line on the upper side of the carrier.

17. The optoelectronic component according to claim 15, wherein one or more optoelectronic semiconductor chips are arranged on the underside of the carrier.

18. The optoelectronic component according to claim 15, wherein a volume portion of the solid body is larger than a sum of the volume fractions portions of the semiconductor chip, the first conversion layer and the carrier for an entire volume of the optoelectronic component.

19. The optoelectronic component according to claim 15,
wherein the semiconductor chip is configured to generate the primary radiation with an intensity maximum at a first wavelength during the operation,
wherein the inorganic phosphor of the first conversion layer is configured to convert the primary radiation into the secondary radiation having an intensity maximum at a second wavelength, the second wavelength being greater than the first wavelength, and
wherein the organic phosphor of the solid body is configured to convert the primary radiation and/or the secondary radiation into tertiary radiation having an intensity maximum at a third wavelength, the third wavelength being greater than the second wavelength.

20. The optoelectronic component according to claim 19, wherein the optoelectronic component comprises a plurality of semiconductor chips lined up along a line on the upper side of the carrier.

* * * * *

UNITED STATES PATENT AND TRADEMARK OFFICE
CERTIFICATE OF CORRECTION

PATENT NO. : 11,158,770 B2  Page 1 of 1
APPLICATION NO. : 16/294789
DATED : October 26, 2021
INVENTOR(S) : Göötz et al.

It is certified that error appears in the above-identified patent and that said Letters Patent is hereby corrected as shown below:

In the Claims

Claim 18, Column 12, Line 41; delete "sum of the volume fractions portions" and insert --sum of the volume portions--.

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*